United States Patent [19]
Wheatley et al.

[11] Patent Number: 5,038,120
[45] Date of Patent: Aug. 6, 1991

[54] FREQUENCY MODULATED PHASE LOCKED LOOP WITH FRACTIONAL DIVIDER AND JITTER COMPENSATION

[75] Inventors: Mark A. Wheatley; Leslie A. Lepper, both of Maidenhead; Nigel K. Webb, Henley-on-Thames, all of England

[73] Assignee: Racal-Dana Instruments Limited, Berkshire, England

[21] Appl. No.: 486,781

[22] Filed: Mar. 1, 1990

[30] Foreign Application Priority Data

Mar. 4, 1989 [GB] United Kingdom ............ 8905004.1

[51] Int. Cl.$^5$ .................... H03C 3/09; H03L 7/18
[52] U.S. Cl. .................... 332/128; 331/16; 331/17; 331/25
[58] Field of Search .............. 331/1 A:10, 11, 14, 331/16, 17, 25; 332/128

[56] References Cited

U.S. PATENT DOCUMENTS

| | | | |
|---|---|---|---|
| 4,052,672 | 10/1977 | Enderby et al. | 332/128 X |
| 4,546,331 | 10/1985 | DaSilva et al. | 332/128 |
| 4,746,870 | 5/1988 | Underhill | 331/1 A X |

FOREIGN PATENT DOCUMENTS

| | | |
|---|---|---|
| 0044154 | 1/1982 | European Pat. Off. |
| 0153868 | 9/1985 | European Pat. Off. |
| 0172425 | 2/1986 | European Pat. Off. |
| 0209754 | 1/1987 | European Pat. Off. |
| 2015277 | 9/1979 | United Kingdom |
| 1560233 | 1/1980 | United Kingdom |
| 2097206 | 10/1982 | United Kingdom |
| 2140232 | 11/1984 | United Kingdom |
| 2140234 | 11/1984 | United Kingdom |

*Primary Examiner*—Siegfried H. Grimm
*Attorney, Agent, or Firm*—Leydig, Voit & Mayer

[57] ABSTRACT

A fractional-N type frequency synthesizer has a voltage controlled oscillator controlled in a phase-locked loop by a divide by N divider and a phase comparator responsive to the divided frequency and to a reference frequency Fr. An accumulator is responsive to the desired fractional part of the N and is clocked by Fr to produce carry signals for producing the required periodic variations in N. A second accumulator produces periodic equal and opposite further variations in N to reduce the magnitude of the error waveform which would be given to the phase-detector output by the variations in n caused by the first accumulator. A digital to analog converter and a differentiating circuit produce a jitter correction signal for reducing residual jitter. A coherent detector detects for the presence of any residual jitter at the control input of the VCO and resulting from the fractional-N control circuit. Any such residual jitter produces a control signal which adjusts the value of the jitter correction signal accordingly. Two-port frequency modulation is produced by an in-band circuit incorporating an integrator and a full band circuit. With no FM input, a counter detects any divergence in output frequency from the desired value and caused by spurious input at the integrator. A resultant control signal offsets any such spurious inputs. The coherent detector detects at the control input of the VCO any component which is coherent with the in band modulation signal and adjusts the full band modulation signal to eliminate this, so that correct FM is produced.

23 Claims, 2 Drawing Sheets

FREQUENCY MODULATED PHASE LOCKED LOOP WITH FRACTIONAL DIVIDER AND JITTER COMPENSATION

BACKGROUND OF THE INVENTION

The invention relates to frequency synthesisers.

SUMMARY OF THE INVENTION

According to the invention, there is provided a frequency synthesiser of the "fractional-N" type, comprising controllable oscillator means having a control input and producing a variable output frequency, variable dividing means having a variable division factor and connected in a phase-locked loop to receive and divide the variable output frequency, phase detecting means in the loop connected to receive the divided frequency and a reference frequency and to compare their phases to produce a phase-dependent error signal connected to the control input of the controllable oscillating means for adjusting it in a sense to minimise the error signal, means for periodically varying the division factor of the dividing means whereby its average value has integer and fractional components and is such that the output frequency has a desired value, means for producing a jitter correction signal for offsetting jitter in the phase-dependent error signal and as produced therein by the periodic variation of the division factor, and detection means for sensing any such jitter in the phase-dependent error signal and for adjusting the jitter correction signal in a sense such as to reduce or eliminate any such jitter.

According to the invention, there is also provided a frequency synthesiser of the "fractional-N" type, comprising controllable oscillator means producing a variable output frequency, variable dividing means having a variable division factor and connected in a phase-locked loop to receive and divide the variable output frequency, phase detecting means in the loop connected to receive the divided frequency and a reference frequency and to compare their phases to produce a phase-dependent error signal for adjusting the controllable oscillating means in a sense to minimise the error signal, means for periodically varying the division factor of the dividing means whereby its average value has integer and fractional components and is such that the output frequency has a desired value, such means comprising first accumulating means connected to receive an input corresponding to the fractional part required for the division factor of the dividing means and for repeatedly adding this input to the contents of the accumulating means at a rate dependent on the reference frequency whereby to Produce an overflow or carry signal for causing periodic variation of the division factor of the dividing means, second accumulator means connected to receive the contents of the first accumulator means and repeatedly to sum those contents with its own contents at a rate dependent on the reference frequency whereby to produce overflow or carry signals which perform repeated and temporary shifts in the phase of the divided frequency with respect to the reference frequency whereby to offset the effect on the phase-dependent error signal which the phase differences detected by the phase detecting means up to the time of each said shift would otherwise have, and jitter correction means responsive to the contents of the second accumulator means for deriving, as a jitter correction signal, a differentiated analogue signal for offsetting jitter in the phase-dependent error signal and as produced therein by the periodic variation of the division factor, the jitter correction means comprising differencing means connected to produce successive difference signals representing the differences between successive values of the accumulating means, whereby to produce a differentiated output, and digital to analogue converting means for producing, as the jitter correction signal, an analogue representation of the output of the differencing means.

According to the invention, there is further provided a frequency synthesiser, comprising controllable oscillator means producing a variable output frequency, variable dividing means having a variable division factor and connected in a phase-locked loop to receive and divide the variable output frequency, phase-detecting means in the loop connected to receive the divided frequency and a reference frequency and to compare their phases to produce a phase-dependent error signal for adjusting the controllable oscillating means in a sense to minimise the error signal, two-port frequency modulation means responsive to a frequency modulation signal and including an in-band circuit and a full band circuit, the in-band circuit including integrating means responsive to the frequency modulation signal for producing a corresponding phase signal which is algebraically added to the phase-dependent error signal, the full band circuit feeding the frequency modulation signal directly to the oscillator means to adjust the output frequency of the latter and calibration means operative in the absence of any frequency modulation signal for detecting drift in the output frequency caused by a spurious input to the integrating means and for producing a correction signal for reducing or eliminating any such drift.

DESCRIPTION OF THE DRAWINGS

A frequency synthesiser embodying the invention will now be described, by way of example only, with reference to the accompanying drawings in which.

DESCRIPTION OF PREFERRED EMBODIMENTS

Figure 1:
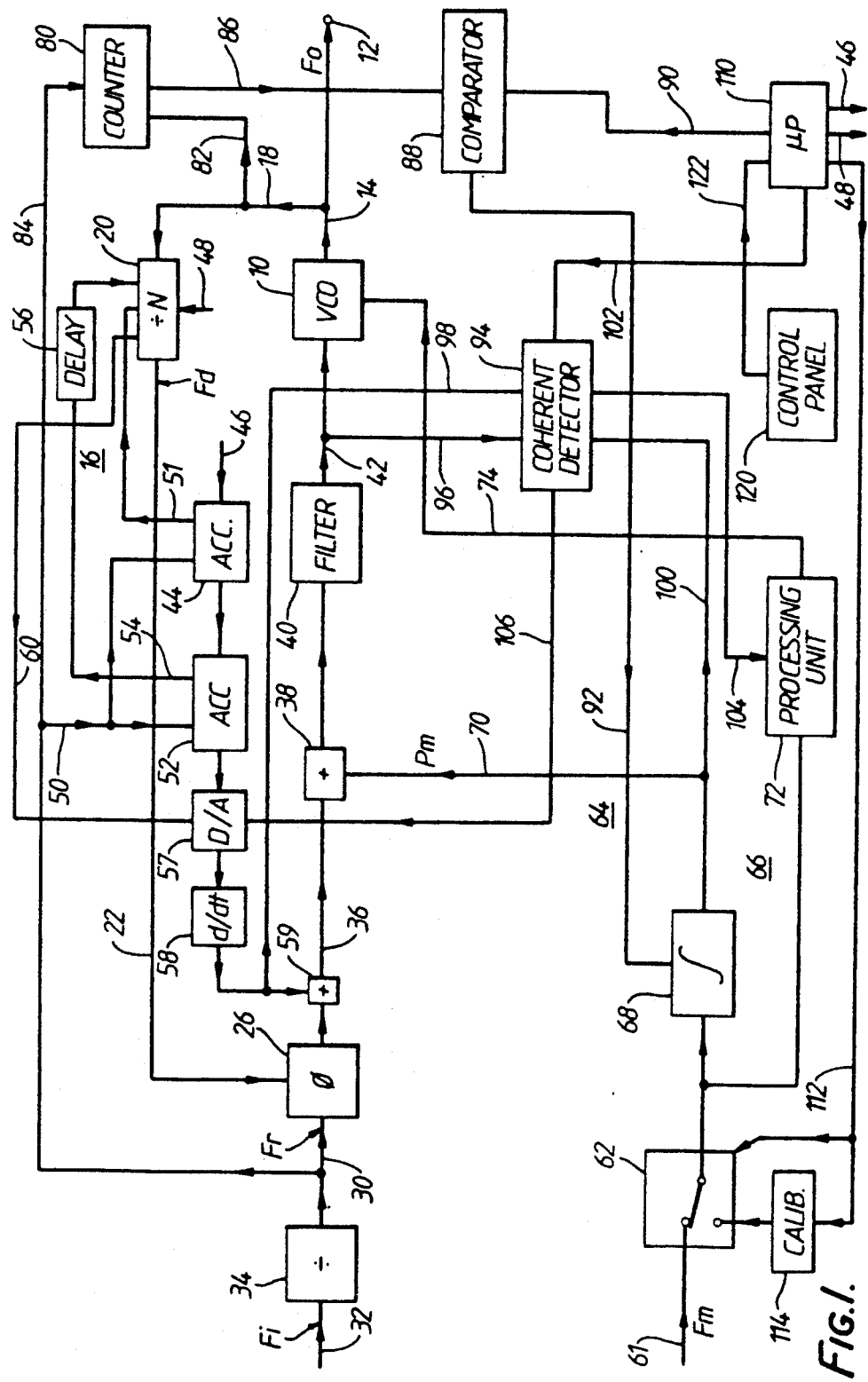
FIG. 1 is a simplified block circuit diagram of the synthesiser.

The frequency synthesiser comprises a voltage controlled oscillator (VCO) 10 producing an output frequency Fo at a terminal 12 via a line 14. The frequency of the oscillator 10 is controlled via a phase-locked loop 16. Thus, the output from VCO 10 is fed via a line 18 to a divider 20 whose output frequency, Fd, is fed via a line 22 to one input of a phase detector 26. The second input of the phase detector receives a signal having a frequency Fr on a line 30. The latter signal is generated from an input signal having a frequency Fi which is received on a line 32 and divided in a fixed divider 34.

In known fashion, the phase detector 26 produces a control signal on a line 36 which is dependent on the difference in phase between the two inputs, Fd and Fr, which it receives. This control signal is fed via an adder 38 and a filter 40 to the VCO 10 via a line 42 and adjusts the frequency (Fo) of the VCO in such direction as to tend to reduce the magnitude of the control signal on line 36 to zero (at which time, the frequencies Fd and Fr will be the same).

Therefore, if the division factor of divider 20 is N, it follows that, when the loop is locked, $$Fd = Fr \qquad (1)$$

However, $$Fd = Fo/N \qquad (2)$$

Therefore, $$Fo = N.Fr \qquad (3)$$

In a practical example, Fi may be 10 MHz and the fixed division factor of divider 34 may be 100. Therefore, Fr is 100 kHz. If N is variable between 500 and 1000 (for example), it follows that Fo is variable between 50 and 100 MHz.

If N is only variable in integer steps, it would follow that the smallest step change in Fo would be equal to the reference frequency Fr (100 kHz in this example). In order to produce much smaller step changes in Fo (steps of 1 Hz for example), the circuit includes means, now to be described, to produce the effect of changing N in fractional steps, thereby producing a "fractional-N" synthesiser.

This is achieved by arranging for Fo to be slightly more than N.Fd so that the value of the control signal on line 36 progressively increases. When Fo has advanced in phase over Fr by one complete cycle, the division factor N is increased by unity so as to remove one complete cycle of Fo. This brings the phase difference between Fr and Fd back to zero. The process then repeats and has the effect of enabling N to have integral and fractional parts, thus permitting Fo to be changed by less than the value of Fr.

In order to produce the required periodic unit changes in the division factor N, the system includes a first accumulator 44 which receives a signal on a channel 46 representing the fractional value of the desired value for N, the integer value being fed to the divider 20 on a channel 48. The accumulator 44 is clocked by the reference frequency Fr by means of line 50 and thus periodically overflows at time instants dependent on the fractional value of N. Each overflow feeds a signal on a line 51 to divider 20 and causes a unit change in the division factor N for the purpose described above, thus bringing Fo and Fr into phase and ensuring that the average value of Fo is equal to N.Fr where N now has integer and fractional parts.

The process described would have the effect of giving the signal on line 36 a saw tooth waveform or jitter, therefore producing unacceptable modulation of Fo. To avoid or reduce this, a second accumulator 52 is provided which is also clocked at the reference frequency by means of the line 50, and in response to each such clock signal, receives the contents of accumulator 44 and adds this to its own, current, contents. The carry output of accumulator 52 is connected via a line 54 and via a delay circuit 56 to divider 20 and serves to increase N to (N+1) during one cycle of Fr and to decrease it to (N−1) during the next such cycle. Therefore, the accumulator 52 causes no net change in N but does considerably reduce the jitter in the control signal on line 36. In order to produce further reduction of the jitter, the output of the accumulator 52 is converted to analogue form in a digital to analogue converter 57 and differentiated in a differentiating circuit 58 and the resultant jitter correction signal is summed in an adder 59 with the output of the phase detector 26 on the line 36. The magnitude of the required jitter correction signal varies with the division factor N and is therefore adjusted in dependence on the value of Fd by means of line 60.

The accumulators 44 and 52 can be connected to be clocked by the signal Fd instead of by the signal Fr.

For a fuller description of the circuitry for adjusting the effective division ratio of divider 20 in fractional steps, reference is made to United Kingdom Patent Specification No. 2026268.

The circuit of FIG. 1 includes means for producing frequency modulation. The FM signal Fm is fed in on a line 61 and passed via a change-over switch 62 to an in-band ("IB") circuit path 64 and a full band circuit 66. The IB circuit comprises an integrator 68 which for the purposes of the Present discussion is assumed to have infinite range) and which integrates signal Fm and produces an output signal Pm on a line 70 which is fed into the second input of adder 38. The full band circuit 66 comprises a processing block 72 which couples signal Fm to a second control input of VCO 10.

When the frequency modulation required by a signal Fm has a frequency outside the bandwidth of the phase-locked loop, the required modulation can be achieved by modulating the output frequency (Fo) of the VCO 10 directly, by means of the signal on line 74 and the full band circuit. Because the required frequency modulation lies outside the bandwidth of the phase-locked loop, the resultant modulation on Fo will be unaffected by the loop. However, if the required frequency modulation lies within the phase-locked loop bandwidth, it cannot be achieved by simple modulation of the frequency of the VCO 10. In other words, where the frequency modulation represented by signal Fm lies within the phase-locked loop bandwidth, a modulation signal fed on line 74 to VCO 10 by the full band circuit would by itself have no useful effect: the resultant frequency excursion of the VCO 10 would be interpreted as an error from the correct value of Fo, as represented by the current values for Fr and N, and the loop would thus produce a control signal on line 36 which would change the VCO output frequency, Fo, so as to cancel the frequency modulation. Therefore, in order to achieve frequency modulation within the bandwidth of the phase-locked loop (in-band modulation), the IB circuit 64 is used. Signal Fm is fed into an input of integrator 68. The integrated output thus represents phase and the corresponding signal Pm is algebraically added to any control signal being output by the phase detector 26. Because the integrator is assumed to have infinite range, DC frequency modulation can be produced.

In accordance with a feature of the invention, the full band circuit also carries the IB signal, that is, the full band circuit includes no filtering intended to block low frequency signals. Therefore, the modulating signal applied on line 74 to VCO 10 corresponds to the signal Pm applied to adder 38, although, of course, the signal on line 74 is in frequency terms whereas signal Pm represents the corresponding phase signal. In response to the signal received on line 74, the VCO output frequency becomes correspondingly modulated. Because the modulation is, in the case being considered, within the bandwidth of the phase-locked loop, it is fed round the loop and produces a corresponding change in the control signal at the output of the phase detector 26, tending to cancel the modulation on Fo. However, this change in the value of the control signal from the phase detector 26 will itself be cancelled by the signal Pm. The result is, therefore, that the modulation on Fo, as produced by the signal on line 74, is preserved.

In other words, all frequency modulation is in fact carried out by the signal on line 74 as produced by the full band circuit 66—that is, even when the required frequency modulation lies within the bandwidth of the phase-locked loop; in the latter case, the cancellation process around the phase-locked loop, which would prevent the signal on line 74 from effecting this frequency modulation, is prevented by the signal Pm generated by the IB circuit 64.

The circuit includes a counter 80 which is connected by a line 82 to monitor the value of the output frequency Fo. The counter is clocked by a clock frequency received on a line 84 and derived from the output of the reference signal divider 34. In this way, the counter makes accurate measurements of the value of Fo and produces a corresponding output signal on a line 86 which is fed to a control unit 88. Control unit 88 also receives an input on a channel 90 representing the currently required value of Fo. Any difference between the actual and desired values of Fo produces a resultant correction signal on a line 92 which is fed to integrator 68 for a purpose to be explained.

The circuit further includes a coherent detector or frequency comparator 94. This receives a number of inputs. One input is derived via a line 96 and represents the control signal at the output of filter 40. Another input is taken on a line 98 from the differentiating circuit 58 and carries a signal representing the value of the jitter correction signal at the output of the differentiating circuit 58. A third input, on line 100, carries a signal corresponding to the signal Pm. The coherent detector is controlled by a control channel 102 and produces outputs on lines 104 and 106. Line 104 is connected to the processing unit 72 in the full band circuit 66. Line 106 is connected to phase detector 26 via digital to analogue converter 57 and differentiator circuit 58.

The operation of the circuit is controlled by a master control unit 110 which may be a microprocessor. The microprocessor produces the control signal on the line 90 for the control unit 88 and the control signal on the channel 102 for the coherent detector 94. In addition, it has an output channel 112 which controls switch 62 and also controls the operation of a calibrating unit 114 connected to the second input of switch 62. For setting up the output frequency of the VCO 10, the microprocessor drives the channels 46 and 48 for controlling the accumulator 44 and the divider 20.

The operation of the circuit will now be considered in greater detail. It is controlled by means of a control panel 120 by means of which an operator sets up the value of the frequency to be synthesized and the value of any FM required and by means of which certain calibration routines can be implemented.

The basic operation has already been described. Thus, when a particular output frequency Fo is to be produced, this is set up by the operator using the input controls 120. Appropriate signals are fed to the microprocessor 110 on channel 122 and the latter outputs corresponding control signals on channels 46 and 48 so as to set up the divider 20 to the correct initial value and to commence counting of the accumulator 44 in the manner explained above. In this way, therefore, the loop 16 controls the VCO 10 to produce the desired output frequency Fo.

During a calibration procedure, which may be initiated manually by the operator using the control panel 120 or automatically by the microprocessor itself, various calibration routines take place which will now be described.

The first calibration routine to be described is intended to eliminate the effects of offsets or drifts at the input of integrator 68.

As already explained, the purpose of the integrator is to respond to the frequency modulation input signal on line 60 by producing a corresponding phase signal, Pm. However, as already stated, the integrator is assumed to have infinite range (therefore producing DC modulation). Thus, if any spurious offset is present at the input of integrator 68, this will cause the output of the integrator to increase continuously, even when signal Fm is zero, consequently simulating a false signal Pm. This will have the effect of producing an offset in the value of Fo. In order to check for this, and to correct it, the microprocessor 90 switches switch 62 to the calibration position, that is, to the position opposite to that illustrated. At the same time, the calibration unit 114 is set to produce zero output. These functions are carried out by signals on channel 112. Therefore, the only input at the integrator 68 will be any spurious offset which is present. By means of channel 90, microprocessor 110 now feeds to frequency comparator 88 a signal representing the correct value of Fo, that is, the value which is set up by the operator on the control panel 120. The counter 80 then counts the actual value of signal Fo and outputs this to the frequency comparator 88 on line 86. If there is any error between the actual and desired values, caused by spurious offset at the input of integrator 68, comparator 88 produces a corresponding correction signal on line 92 which is fed to the integrator and compensates for the offset so as to return signal Fo to the correct value.

The second calibration routine is concerned with checking the correct operation of the IB circuit 64 and the full band circuit 66. As already explained, for correct operation it is necessary that any control signal produced by phase detector 26 in response to frequency modulation on Fo caused by the signal on line 74 is exactly cancelled by the IB signal, Pm. If exact cancellation is not achieved, incorrect frequency modulation will take place. The required calibration routine is carried out by the coherent detector 94 under control of the microprocessor by means of signals on channel 102. During this calibration routine, the coherent detector 94 compares the signals received on lines 96 and 100. If correct frequency modulation is taking place, there should be no signal on line 96 which is coherent with the signal on line 100. The signal on line 100 is the signal Pm, and, if correct cancellation is being achieved by signal Pm in adder 38, the latter signal will exactly balance, and be cancelled by, the signal passing around the loop as a result of direct modulation of the VCO frequency by the signal on line 74. If the coherent detector 94 detects any signal on line 96 which is coherent with the signal on line 100, the resultant correction signal is produced on line 104 and this adjusts the processing circuit 22 in the full band circuit 64 in such a way as to adjust the full band signal on line 74 until the error signal on line 96 is eliminated and correct frequency modulation is achieved.

The third calibration routine is concerned with the correct operation of the jitter correction carried out by the signal produced by the digital to analogue converter 57 and the differentiating circuit 58. As already explained, this jitter correction signal is intended to cancel out residual jitter on the output of the phase detector 26 which remains after the partial jitter cancellation process carried out by accumulator 52. The third calibration routine is also carried out by the coherent detector 94.

The coherent detector 94 is switched into the third calibration routine by signals on channel 102 and it checks the signal on line 96 for coherence with the signal on line 98. The signal on line 98 represents the jitter correction signal. If line 96 carries any signal coherent with this, this indicates that jitter correction has not been completely achieved. An appropriate correction signal is therefore output on line 106 and fed to phase detector 26 (via digital to analogue converter 57 and differentiator 58) so as to compensate and finally eliminate the jitter.

Figure 2:
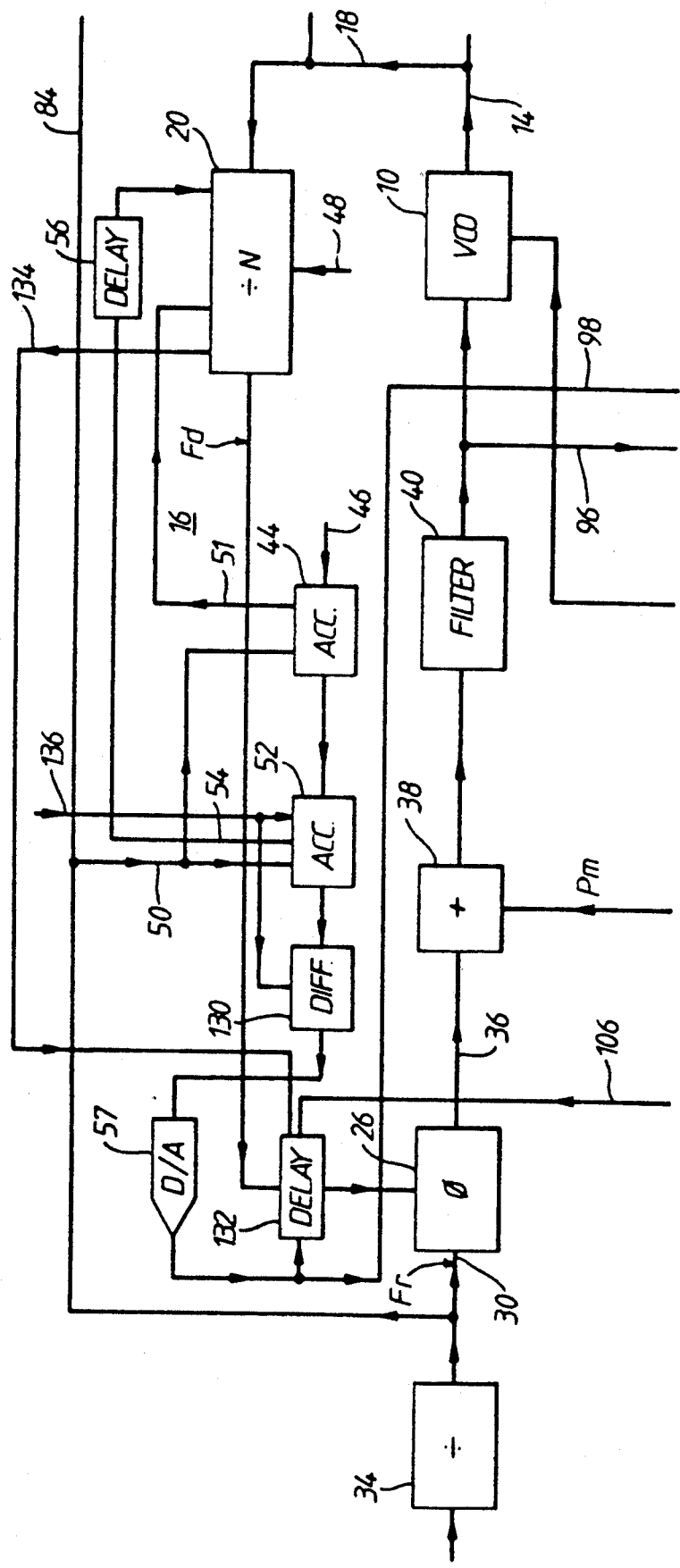
FIG. 2 is a block diagram corresponding to part of FIG. 1 but showing modifications.

FIG. 2 illustrates part, only, of the circuit of FIG. 1 and shows some modifications. Items in FIG. 2 corresponding to those in FIG. 1 are similarly referenced.

As shown in FIG. 2, the differentiating circuit 58 connected to the output of the digital to analogue converter 57, for producing the jitter correction signal, is eliminated. Instead, a differencing circuit 130 is connected to the output of the accumulator 52 and detects the difference between successive digital signals, the difference output then being fed to the digital to analogue converter 57. Differencing circuit 130 thus performs the function of the differentiating circuit 58 of FIG. 1. However, the arrangement shown in FIG. 1 could be used instead.

In addition, the loop includes a variable delay circuit 132. The jitter correction signal from the digital to analogue converter 57 is fed to the variable delay circuit 132 instead of to the output of the phase comparator 26 (as in FIG. 1). In other words, jitter correction is achieved by phase shifting one of the two inputs to the phase comparator 26 instead of by adjusting the magnitude of the phase difference signal produced by the phase detector. In the circuit of FIG. 2, the correction signal on line 106 from the coherent detector 94 is thus fed to the variable delay circuit 132, and adjusts the delay correspondingly, instead of to the digital to analogue detector 57.

A further input is fed to the variable delay 132 on a line 134. This varies the amount of the delay in dependence on the division ratio of divider 20 in order to provide correct matching as the value of signal Fd changes. The signal on line 134 therefore takes the place of the signal on line 60 in the circuit of FIG. 1.

The circuit of FIG. 2 includes a further control input on a line 136 from the microprocessor 110. The purpose of this control input is to disable accumulator 52 and the differencing circuit 130 during periods when there is no fractional value of N required. Without such disabling, accumulator 52 would continually overflow and would generate unnecessary divider value changes (N+1/N−1), leading to phase jitter at the VCO 10; this is because the jitter cancellation provided at the output of the digital to analogue converter 57 can never be perfect.

Instead, the input line 46 can be set to zero and would achieve the same effect except that phase continuity would be lost.

What is claimed is:

1. A frequency synthesiser of the "fractional-N" type, comprising controllable oscillator means having a control input and producing a variable output frequency, variable dividing means having a variable division factor and connected in a phase-locked loop to receive and divide the variable output frequency.

phase detecting means in the loop connected to receive the divided frequency and a reference frequency and to compare their phases to produce a phase-dependent error signal connected to the control input of the controllable oscillator means for adjusting it in a sense to minimise the error signal, means for periodically varying the division factor of the dividing means whereby its average value has integer and fractional components and is such that the output frequency has a desired value, said means comprising first accumulator means connected to receive an input corresponding to the fractional part required for the division factor of the dividing means and for repeatedly adding this input to the contents of the first accumulator means at a rate dependent on the reference frequency whereby to produce an overflow or carry signal for causing the periodic variation of the division factor of the dividing means, jitter correction means for producing a jitter correction signal for offsetting jitter in the phase-dependent error signal as produced therein by said periodic variation, detection means for sensing any such jitter in the phase-dependent error signal and for adjusting the jitter correction signal in a sense such as to reduce or eliminate any such jitter.

means operative within each period of variation of the division factor to cause repeated and temporary shifts in the phase of the divided frequency with respect to the reference frequency whereby to offset the effect on the phase-dependent error signal which the phase differences detected by the phase detecting means up to the time of each said shift would otherwise have, said means comprising second accumulator means connected to receive the contents of the first accumulator means and repeatedly to sum those contents with its own contents at a rate dependent on the reference frequency whereby to produce overflow or carry signals each of which carries out one said repeated and temporary shift in the phase of the divided frequency, said jitter correction means comprising means responsive to the contents of the second accumulator means for deriving, as the jitter correction signal, a differentiated analogue signal.

2. A synthesiser according to claim 1, in which the detection means comprises coherent detection means connected to receive the phase-dependent error signal and the jitter correction signal or signals dependent thereon and to sense for any component of the phase-dependent error signal which is coherent with the jitter correction signal and to produce an output accordingly, and means responsive to this output to adjust the value of the jitter correction signal accordingly.

3. A synthesiser according to claim 1, in which the jitter correction means comprises differencing means connected to produce successive difference signals representing the differences between successive values of the second accumulator means whereby to produce a differentiated output, and digital to analogue converting means for producing, as the jitter correction signal, an analogue representation of the output of the differencing means.

4. A synthesiser according to claim 1, including disabling means for disabling the second accumulator means and the jitter correction means when the division factor of the dividing means has an integer part only.

5. A synthesiser according to claim 1, comprising frequency modulating means responsive to a frequency modulation signal to produce first and second FM control signals, means applying the first FM control signal to the oscillator means to modulate the output frequency of the latter, and means applying the second FM control signal as a corresponding phase-dependent signal within the loop bandwidth in association with the phase-dependent error signal, the paths for both FM control signals being DC responsive and DC coupled whereby variations of the first FM control signal which are within the bandwidth of the loop, and therefore fed back via the loop, are substantially cancelled by corresponding variations of the second FM control signal.

6. A synthesiser according to claim 5, including first calibrating means for detecting, within the loop and at the control input of the oscillator means, the presence of signal variations corresponding to the variations of the second FM control signal relative to the first FM control signal and, in response to such detection, producing an FM correction signal for minimising any such detected variations.

7. A synthesiser according to claim 6, in which the calibrating means includes coherent detecting means connected to receive the signal at the control input of the oscillator means and a signal corresponding to the second FM control signal and to test for coherence between them.

8. A synthesiser according to claim 7, in which the FM correction signal is connected to means for adjusting the first FM signal.

9. A synthesiser according to claim 5, including frequency modulation signal integrating means connected to receive the frequency modulation signal and to integrate it to produce the second FM control signal, frequency measuring means for measuring the actual value of the output frequency of the oscillator means and for comparing this actual value with the desired value thereof, and frequency correction means responsive to any difference detected by the measuring means for producing a control signal for adjusting the frequency modulation signal integrating means in a sense to eliminate the said difference.

10. A synthesiser according to claim 9, including means for preventing the application of any frequency modulation signal at the input of the frequency modulation signal integrating means while the frequency measuring means is measuring the output frequency of the oscillator means.

11. A synthesiser according to claim 9, in which the frequency measuring means comprises counting means.

12. A synthesiser according to claim 11, in which the counting means is clocked in dependence on the said reference frequency.

13. A frequency synthesiser of the "fractional-N" type, comprising controllable oscillator means producing a variable output frequency, variable dividing means having a variable division factor and connected in a phase-locked loop to receive and divide the variable output frequency, phase detecting means in the loop connected to receive the divided frequency and a reference frequency and to compare their phases to produce a phase-dependent error signal for adjusting the controllable oscillator means in a sense to minimise the error signal, means for periodically varying the division factor of the dividing means whereby its average value has integer and fractional components and is such that the output frequency has a desired value, such means comprising first accumulator means connected to receive an input corresponding to the fractional part required for the division factor of the dividing means and for repeatedly adding this input to the contents of the accumulator means at a rate dependent on the reference frequency whereby to produce an overflow or carry signal for causing periodic variation of the division factor of the dividing means, second accumulator means connected to receive the contents of the first accumulator means and repeatedly to sum those contents with its own contents at a rate dependent on the reference frequency whereby to produce overflow or carry signals which perform repeated and temporary shifts in the phase of the divided frequency with respect to the reference frequency whereby to offset the effect on the phase-dependent error signal which the phase differences detected by the phase detecting means up to the time of each said shift would otherwise have, and jitter correction means responsive to the contents of the second accumulator means for deriving, as a jitter correction signal, a differentiated analogue signal for offsetting jitter in the phase-dependent error signal and as produced therein by the periodic variation of the division factor, the jitter correction means comprising differencing means connected to produce successive difference signals representing the differences between successive values of the second accumulator means, whereby to produce a differentiated output, and digital to analogue converting means for producing, as the jitter correction signal, an analogue representation of the output of the differencing means.

14. A synthesiser according to claim 13, including disabling means for disabling the second accumulator means and the jitter correction means when the division factor of the dividing means has an integer part only.

15. A frequency synthesiser, comprising controllable oscillator means producing a variable output frequency, variable dividing means having a variable division factor and connected in a phase-locked loop to receive and divide the variable output frequency, phase-detecting means in the loop connected to receive the divided frequency and a reference frequency and to compare their phases to produce a phase-dependent error signal for adjusting the controllable oscillator means in a sense to minimise the error signal, two-port frequency modulation means responsive to a frequency modulation signal and including an in-band circuit and a full band circuit, the in-band circuit including integrating means responsive to the frequency modulation signal for producing a corresponding phase signal which is algebraically added to the phase-dependent error signal, the full band circuit feeding the frequency modulation signal directly to the oscillator means to adjust the output frequency of the latter, and calibration means operative in the absence of any frequency modulation signal for detecting drift in the output frequency caused by a spurious input to the integrating means and for producing a correction signal for reducing or eliminating any such drift.

16. A synthesiser according to claim 15, in which the calibration means comprises a frequency counter clocked in dependence on the reference frequency and connected to measure the actual value of the output frequency, comparing means for comparing the measured value of the output frequency with the desired value thereof and to produce the said correction signal accordingly, and means for feeding this correction signal to the integrating means to adjust the latter accordingly.

17. A frequency synthesiser of the "fractional-N" type, comprising controllable oscillator means having a control input and producing a variable output frequency, variable dividing means having a variable division factor and connected in a phase-locked loop to receive and divide the variable output frequency, phase detecting means in the loop connected to receive the divided frequency and a reference frequency and to compare their phases to produce a phase-dependent error signal connected to the control input of the controllable oscillator means for adjusting it in a sense to minimise the error signal, means for periodically varying the division factor of the dividing means whereby its average value has integer and fractional components and is such that the output frequency has a desired value, means for producing a jitter correction signal for offsetting jitter in the phase-dependent error signal and as produced therein by the periodic variation of the division factor, detection means for sensing any such jitter in the phase-dependent error signal and for adjusting the jitter correction signal in a sense such as to reduce or eliminate any such jitter, frequency modulating means responsive to a frequency modulation signal to produce first and second FM control signals, means applying the first FM control signal to the oscillator means to modulate the output frequency of the latter, means applying the second FM control signal as a corresponding phase-dependent signal within the loop bandwidth in association with the phase-dependent error signal, the paths for both FM control signals being DC responsive and DC coupled whereby variations of the first FM control signal which are within the bandwidth of the loop, and therefore fed back via the loop, are substantially cancelled by corresponding variations of the second FM control signal, and first calibrating means for detecting, within the loop and at the control input of the oscillator means, the presence of signal variations corresponding to the variations of the second FM control signal relative to the first FM control signal and, in response to such detection, producing an FM correction signal for minimising any such detected variations.

18. A synthesiser according to claim 17, in which the calibrating means includes coherent detecting means connected to receive the signal at the control input of the oscillator means and a signal corresponding to the second FM control signal and to test for coherence between them.

19. A synthesiser according to claim 18, in which the FM correction signal is connected to means for adjusting the first FM control signal.

20. A frequency synthesiser of the "fractional-N" type, comprising controllable oscillator means having a control input and producing a variable output frequency, variable dividing means having a variable division factor and connected in a phase-locked loop to receive and divide the variable output frequency, phase detecting means in the loop connected to receive the divided frequency and a reference frequency and to compare their phases to produce a phase-dependent error signal connected to the control input of the controllable oscillator means for adjusting it in a sense to minimise the error signal, means for periodically varying the division factor of the dividing means whereby its average value has integer and fractional components and is such that the output frequency has a desired value, means for producing a jitter correction signal for offsetting jitter in the phase-dependent error signal and as produced therein by the periodic variation of the division factor, detection means for sensing any such jitter in the phase-dependent error signal and for adjusting the jitter correction signal in a sense such as to reduce or eliminate any such jitter, frequency modulating means responsive to a frequency modulation signal to produce a first FM control signal, frequency modulation signal integrating means connected to receive the frequency modulation signal and to integrate it to produce a second FM control signal, means applying the first FM control signal to the oscillator means to modulate the output frequency of the latter, means applying the second FM control signal as a corresponding phase-dependent signal within the loop bandwidth in association with the phase-dependent error signal, the paths for both FM control signals being DC responsive and DC coupled whereby variations of the first FM control signal which are within the bandwidth of the loop, and therefore fed back via the loop, are substantially cancelled by corresponding variations of the second FM control signal, frequency measuring means for measuring the actual value of the output frequency of the oscillator means and for comparing this actual value with the desired value thereof, and frequency correction means responsive to any difference detected by the frequency measuring mans for producing a control signal for adjusting the frequency modulation signal integrating means in a sense to eliminate the said difference.

21. A synthesiser according to claim 20, including means for preventing the application of any frequency modulation signal at the input of the frequency modulation signal integrating means while the frequency measuring means is measuring the output frequency of the oscillator means.

22. A synthesiser according o claim 20, in which the frequency measuring means comprises counting means.

23. A synthesiser according to claim 22, in which the counting means is clocked in dependence on the said reference frequency.

* * * * *